(12) United States Patent
Furumiya et al.

(10) Patent No.: US 7,095,072 B2
(45) Date of Patent: Aug. 22, 2006

(54) SEMICONDUCTOR DEVICE WITH WIRING LAYERS FORMING A CAPACITOR

(75) Inventors: Masayuki Furumiya, Kanagawa (JP); Hiroaki Ohkubo, Kanagawa (JP); Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/753,325

(22) Filed: Jan. 9, 2004

(65) Prior Publication Data

US 2004/0140487 A1 Jul. 22, 2004

(30) Foreign Application Priority Data

Jan. 16, 2003 (JP) ............... 2003-008286

(51) Int. Cl.
*H01L 27/108* (2006.01)
*H01L 29/76* (2006.01)
*H01L 29/94* (2006.01)
*H01G 4/228* (2006.01)
*H01G 4/30* (2006.01)

(52) U.S. Cl. .............. 257/307; 257/309; 257/313; 361/306.1; 361/306.2; 361/306.3; 361/301.4

(58) Field of Classification Search .......... 257/211, 257/296, 307, 309, 313, 207; 361/306.1, 361/306.2, 306.3, 309, 301.1, 301.4, 313, 361/329

See application file for complete search history.

(56) References Cited

U.S. PATENT DOCUMENTS 6,690,570 B1 2/2004 Hajimiri et al.

2002/0047154 A1 4/2002 Sowlati et al.

FOREIGN PATENT DOCUMENTS

| EP | 1 024 536 A2 | * | 8/2000 | ............... 257/296 |
|---|---|---|---|---|
| JP | 2001-358295 A | | 12/2001 | |
| JP | 2002-124575 A | | 4/2002 | |
| JP | 2002-222934 A | | 8/2002 | |
| JP | 2002-324843 A | | 11/2002 | |
| JP | 2002-353328 A | | 12/2002 | |
| JP | 2003-530699 A | | 10/2003 | |

OTHER PUBLICATIONS

M. Armacost et al., "A High Reliability Metal Insulator Metal Capacitor for 0.18 μm Copper Technology", IEDM2000, pp. 157-160 with Abstract.

* cited by examiner

*Primary Examiner*—Steven Loke
(74) *Attorney, Agent, or Firm*—Sughrue Mion, PLLC

(57) ABSTRACT

A semiconductor device, in which four pieces of strip-shaped electrodes, whose longitudinal directions are the same, are formed in each layer of a plurality of wiring layers that are provided by a same design rule with each other, simultaneously with regular wirings. In each wiring layer, two pieces each of first electrode and second electrode are formed parallelly with each other, alternately, and remote from each other. Then, the first electrodes formed in each layer are connected to each other by a first via, the second electrodes formed in each layer are connected to each other by a second via, a first structure body formed by connecting the first electrodes and the first via to each other is connected to a ground wiring, and a second structure body formed by connecting the second electrodes and the second via to each other is connected to a power source wiring.

20 Claims, 6 Drawing Sheets

SEMICONDUCTOR DEVICE WITH WIRING LAYERS FORMING A CAPACITOR

BACKGROUND OF THE INVENTION

1. Field of the Invention

The present invention relates to a semiconductor device equipped with an MIM (Metal-Insulator-Metal) capacitor, particularly to a semiconductor device whose manufacturing process has been simplified.

2. Description of the Related Art

For example, as disclosed in the literature M. Armacost, et. al. "A High Reliability Metal Insulator Metal Capacitor for 0.18 μm Copper Technology" IEDM2000 pp. 157–160', a lower electrode, a capacitance insulating film, and an upper electrode are laminated on a substrate in this order to form the MIM capacitor when forming a capacitor in the semiconductor device conventionally.

FIG. 1 is a sectional view showing a semiconductor device equipped with a conventional MIM capacitor. As shown in FIG. 1, in the conventional semiconductor device, an oxide film 102 is provided on a substrate 101, and a lower electrode 103 made of metal is provided thereon. Then, a capacitance insulating film 104 is provided on the lower electrode 103, an upper electrode 105 is provided on the capacitance insulating film 104, and a cap film 106 is provided on the upper electrode 105. The upper electrode 105 is connected to wiring 109 via an underlying layer 107 and a via 108, and the lower electrode 103 is connected to wiring 111 via the underlying layer 107 and a via 110. Thus, the lower electrode 103, the capacitance insulating film 104, and the upper electrode 105 form an MIM capacitor 112. Further, the lower electrode 103, the capacitance insulating film 104, the upper electrode 105 and the like are buried in an interlayer insulating film 113.

Further, Japanese Patent Laid-Open No. 2002-222934 publication, for example, discloses a technique where the capacitance insulating film and the upper electrode are formed so as to cover the lower electrode and the MIM capacitor is formed by using not only the top surface but also the sides of the lower electrode.

FIG. 2A is a plan view showing the semiconductor device equipped with the conventional MIM capacitor. FIG. 2B is a sectional view by D—D line shown in FIG. 2A. As shown in FIGS. 2A and 2B, a silicon substrate 121 is provided for the conventional semiconductor device, and a diffusion layer 122 is formed on a part of the surface of the silicon substrate 121. Further, an interlayer insulating film 123 is provided on the silicon substrate 121, and a plug 124 connected to the diffusion layer 122 is formed in the interlayer insulating film 123. Moreover, a lower electrode 125 is provided on the interlayer insulating film 123 so as to connect to the plug 124, and a barrier insulating layer 126 and a high-permittivity film 127 are provided so as to cover the lower electrode 125. Then, the barrier insulating layer 126 and the high-permittivity film 127 form a capacitance insulating film 128. Further, an upper electrode 129 is provided so as to cover the capacitance insulating film 128. Consequently, the lower electrode 125, the capacitance insulating film 128, and the upper electrode 129 form a capacitor 130. According to this prior art, the capacitor can be formed not only on the top surface but also to the sides of the lower electrode 125.

However, the above-described prior art has the following problems. As described above, in the case of forming the capacitor by laminating the lower electrode, the capacitance insulating film, and the upper electrode in this order, the lower electrode can be formed in the wiring layer of the semiconductor device simultaneously with other wiring. However, when a regular interlayer insulating film is used as the capacitance insulating film, the capacitance insulating film becomes too thick because the thickness of the interlayer insulating film is approximately 0.3 to 1.0 μm, and the capacitance value of capacitor is reduced. For this reason, an insulating film having the thickness of approximately 50 nm is specially formed as the capacitance insulating film, and the upper electrode is formed on the capacitance insulating film. As a result, special process for forming the capacitance insulating film and the upper electrode is necessary, the number of masks increases by about 1 to 2 pieces and additional etching process is also required comparing to the case where the capacitor is not formed. Consequently, the manufacturing process of semiconductor device becomes complicate, which leads to an increased manufacturing cost.

SUMMARY OF THE INVENTION

An object of the present invention is to provide a semiconductor device that does not require special process for forming the capacitor in the semiconductor device equipped with the MIM capacitor.

The semiconductor device according to the present invention comprises a plurality of wiring layers that are laminated with each other, in which each of the wiring layers includes the interlayer insulating film, first and second electrodes buried in the interlayer insulating film and remote from each other, a first via that connects the first electrode and the first electrode of the wiring layer provided on its upper layer or lower layer to each other, and a second via that connects the second electrode and the second electrode of the wiring layer provided on its upper layer or lower layer to each other, and the first electrode and the first via are connected to a first terminal, the second electrode and the second via are connected to a second terminal, and a capacitor is formed between the first electrode and the first via, and the second electrode and the second via.

In the present invention, the first and second electrodes can be formed simultaneously with regular wiring and the first and second via can be formed simultaneously with regular via, in the wiring layers of the semiconductor device. For this reason, there is no need to provide the special process for forming the capacitor. Further, the first and second electrodes are formed in a plurality of wiring layers, the first via connects the first electrodes, the second via connects the second electrodes, the first electrode and the first via are connected to the first terminal, and the second electrode and the second via are connected to the second terminal, so that the capacitor is formed between the first electrode and the first via, and the second electrode and the second via. As described, by forming a capacitor structure in a vertical stack structure, the capacitance value of the capacitors per unit area can be increased.

Further, it is preferable that a plurality of the wiring layers are provided in a same design rule with each other. Thus, the first and second electrodes having a same shape can be formed in each wiring layer, which facilitates the designing of capacitor and further improves the capacitance value per unit area.

Furthermore, it is preferable that the wiring layers are provided in three or more layers. Thus, effect by forming the capacitor structure in the vertical stack structure becomes conspicuous, which further improves the capacitance value of the capacitors per unit area.

Furthermore, it is preferable that a plurality of the first via are arranged in a position where they overlap with each other and a plurality of the second via are arranged in a position where they overlap with each other, viewing from the lamination direction of the wiring layers. Thus, the distance between the first via provided in one wiring layer and the first via provided in another wiring layer becomes small, and the internal resistance of a structure body that consists of the first electrode and the first via can be reduced. Similarly, the internal resistance of a structure body that consists of the second electrode and the second via can be reduced as well. In addition, since the distance between the first via and the second via can be small in a same wiring layer, the capacitance value between the first via and the second via is increased.

Still further, it is preferable that a plurality of the first electrodes are arranged in a position where they overlap with each other and a plurality of the second electrode are arranged in a position where they overlap with each other, viewing from the lamination direction of the wiring layers. Thus, the area of capacitor can be reduced viewing from the lamination direction of the wiring layers, and as a result, the capacitance value per unit area is increased.

Furthermore, it is preferable that the distance between the first electrode and the second electrode is 0.3 µm or less in the same wiring layer, more preferably it is 0.2 µm or less. Thus, the distance between electrodes becomes as small as approximately four to six times the thickness of a conventional capacitance insulating film (50 nm, for example), and the capacitance value is increased.

Still further, it is preferable that, in the same wiring layer, the distance between the first electrode and the second electrode is the minimum value allowed by the design rule of the wiring layer, and it is preferable that the distance between the first via and the second via that is formed in the closest position to the first via is the minimum value allowed by the design rule of the wiring layer. Furthermore, it is preferable that the via in each electrode are arranged in one line along a longitudinal direction of electrode and all the first via are arranged so as to face the second via respectively. Thus, in the same wiring layer, the distance between the first electrode and the second electrode and the distance between the first via and the second via can be small, and the capacitance value of capacitors is increased.

Still further, it is preferable that the first and second electrodes are in strip shapes that are parallel to each other. Thus, the area of sides that contributes to the capacitance value of capacitor in the first and second electrodes can be increased, and the capacitance value of capacitors per unit area is increased.

At this point, it is preferable that, regarding the first and second electrodes, the first and second via are provided in plural numbers by being arrayed in the longitudinal direction of a plurality of the first and second electrodes. Thus, all first via face the second via, and the capacitance value of entire capacitors increases.

Further, at this point, it is preferable that the distance between the first via in the longitudinal direction of the first electrode is larger than the distance between the first and second via of the first and second electrodes that are adjacent in each of the wiring layers, and the distance between the second via in the longitudinal direction of the second electrode is larger than the distance between the first and second via of the first and second electrodes that are adjacent in each of the wiring layers. Thus, the accuracy of lithography when forming the first and second via is secured without increasing the distance between the first via and the second via, and the first via is prevented from contacting the second via.

Alternatively, at least one of the first and second via is a slit-shaped via extending in the longitudinal direction of the first and second electrodes.

Furthermore, the semiconductor device according to the present invention comprises an integrated circuit section, and the diameter of the first and second via may be larger than the diameter of the via provided in the integrated circuit section. Thus, the side area of the first and second via is increased, the gap between the first via and the second via becomes small, and the capacitance value between the first and second via is increased.

Still further, the first terminal is connected to ground wiring, the second terminal is connected to power source wiring, and the capacitor may be a decoupling capacitor connected to a power source in parallel. Thus, power source noise can be absorbed, and the operation of the semiconductor device is stabilized.

Further, the semiconductor device according to the present invention comprises an upper electrode, which is provided in a region including a region immediately under the first and second electrodes and connected to one of the first and second terminals, an insulating film provided under the upper electrode, and a lower electrode, which is provided under the insulating film and connected to the other one of the first and second terminals, and another capacitor may be formed between the upper electrode and the lower electrode. Thus, a total capacitance value of the capacitors and another capacitor can be obtained, which further improves the capacitance value of capacitor per unit area.

Furthermore, the semiconductor device comprises an N-type semiconductor layer, which is provided in a region including the region immediately under the first and second electrodes and connected to one terminal out of the first and second terminals, to which higher potential is applied, and a P-type semiconductor layer, which is provided in a region including the region immediately under the electrodes so as to contact the N-type semiconductor layer and connected to one terminal out of the first and second terminals, to which lower potential is applied, and still another capacitor may be formed between the N-type semiconductor layer and the P-type semiconductor layer. Thus, a total capacitance value of the capacitor and still another capacitor can be obtained, which further improves the capacitance value of capacitor per unit area.

Further, the semiconductor device comprises a semiconductor substrate arranged under the wiring layers, and the semiconductor substrate includes an N-type semiconductor region, which is provided in a region including the region immediately under the first and second electrodes and connected to one terminal out of the first and second terminals, to which higher potential is applied, and a P-type semiconductor region, which is provided in a region including the region immediately under the electrodes so as to contact the N-type semiconductor region and connected to one terminal out of the first and second terminals, to which lower potential is applied, and still another capacitor may be formed between the N-type semiconductor region and the P-type semiconductor region. Thus, a total capacitance value of the capacitor and still another capacitor can be obtained, which further improves the capacitance value of capacitor per unit area.

According to the present invention, the first and second electrodes can be formed simultaneously with the regular wiring and the first and second via can be formed simultaneously with the regular via in each wiring layer of the semiconductor device. For this reason, the semiconductor device equipped with the MIM capacitor can be fabricated without the need of the special process for forming the capacitors.

DETAILED DESCRIPTION OF THE PREFERRED EMBODIMENT

Figure 1:
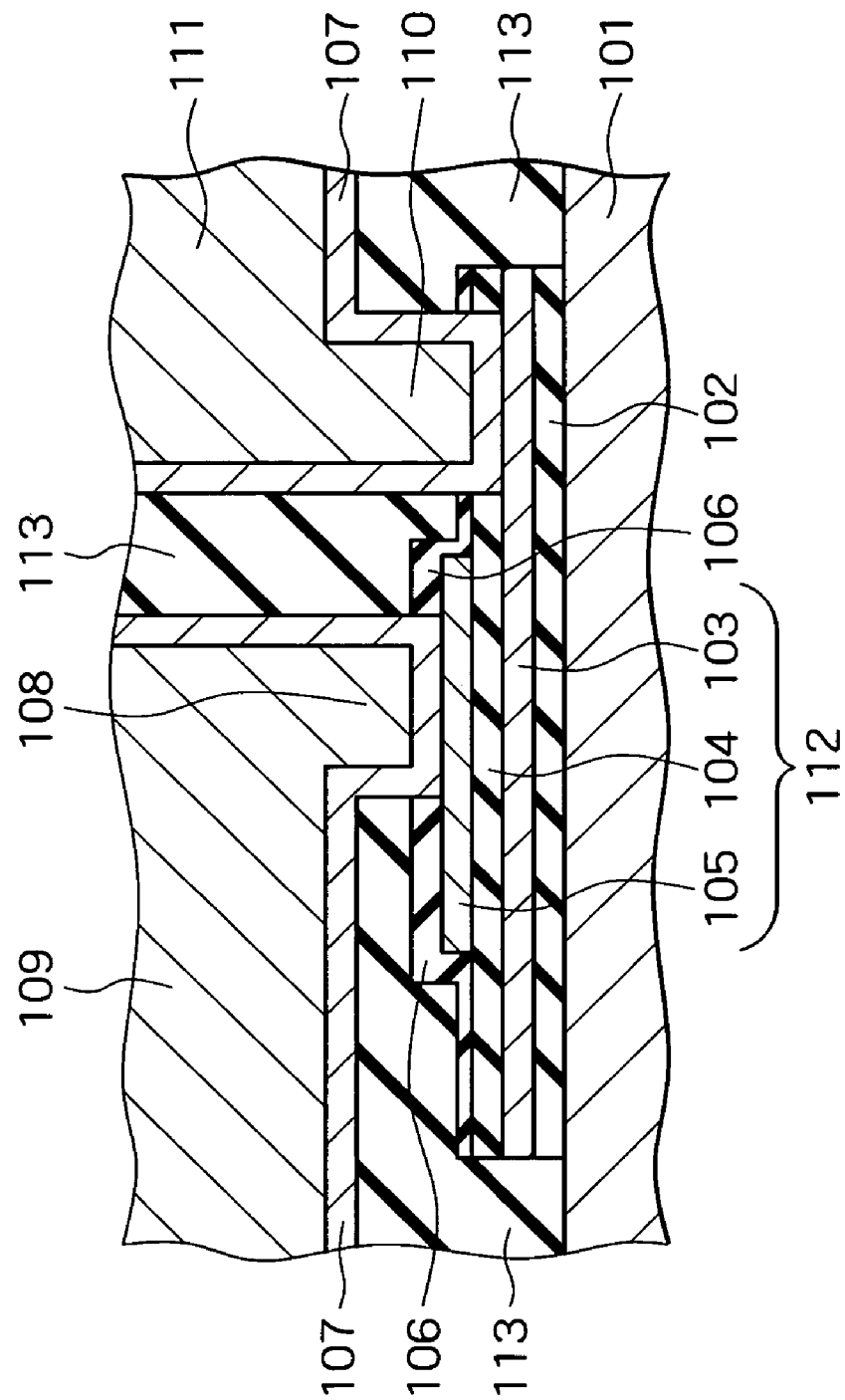
FIG. 1 is a sectional view showing a semiconductor device equipped with the conventional MIM capacitor.
Figure 2A:
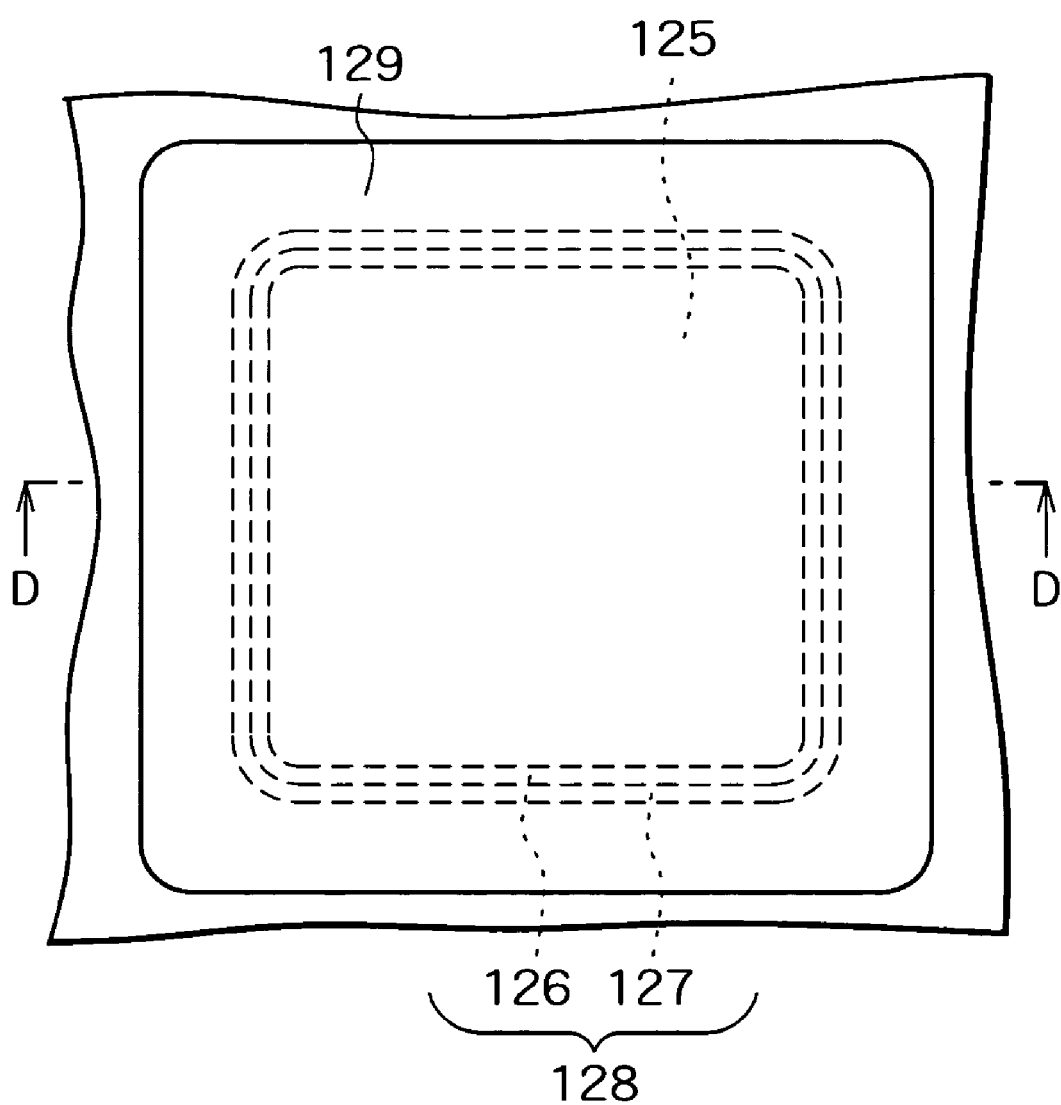
FIG. 2A is a plan view showing a semiconductor device equipped with another conventional MIM capacitor.
Figure 2B:
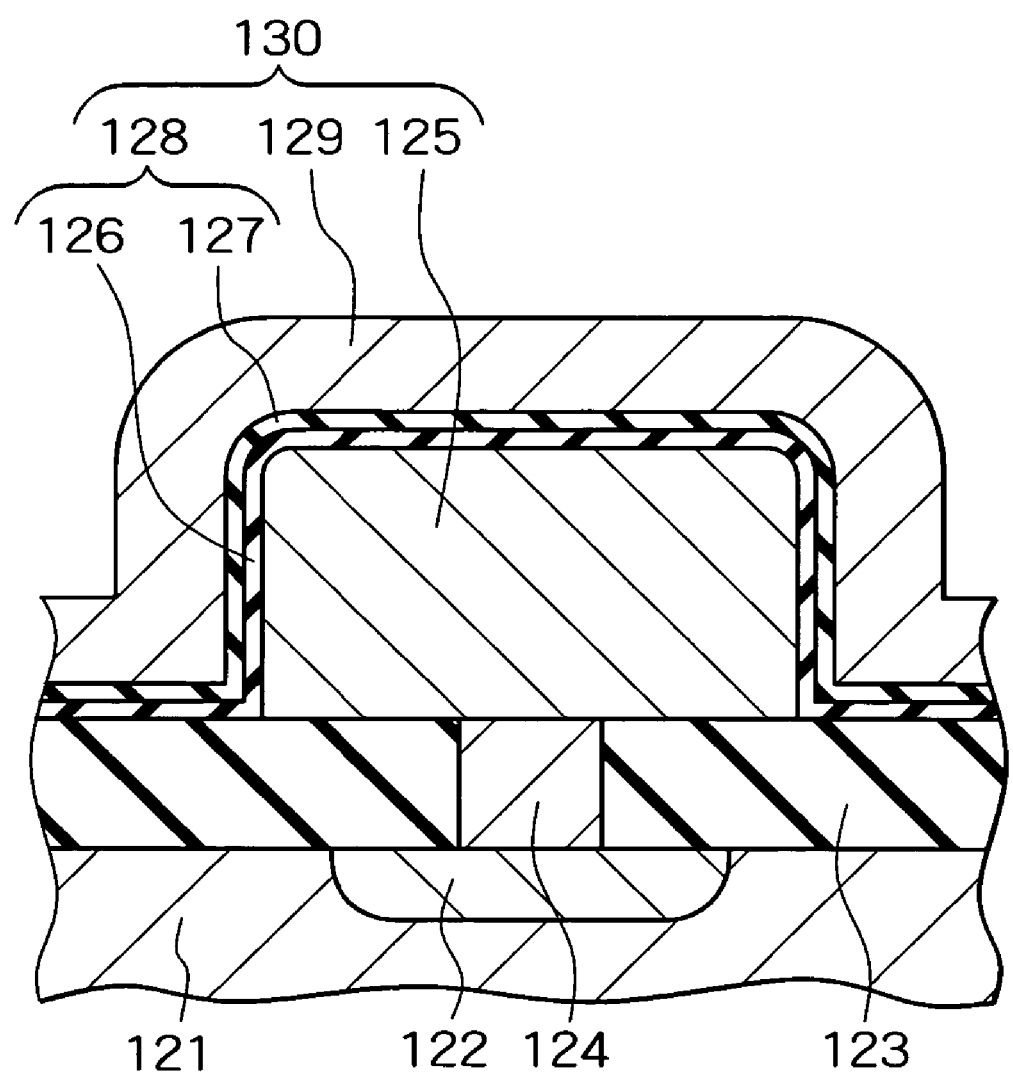
FIG. 2B is a sectional view by D—D line shown in FIG. 2A.
Figure 3:
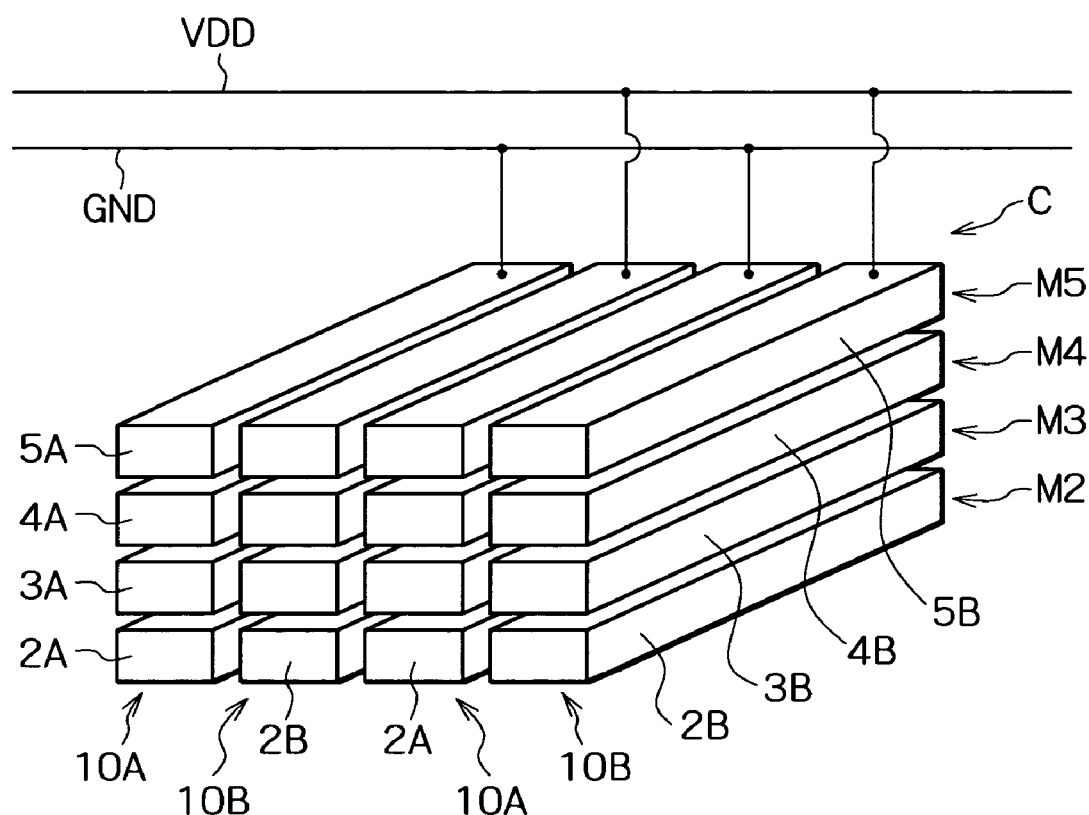
FIG. 3 is a perspective view showing the MIM capacitor provided in the semiconductor device according to the embodiments of the present invention.
Figure 4:
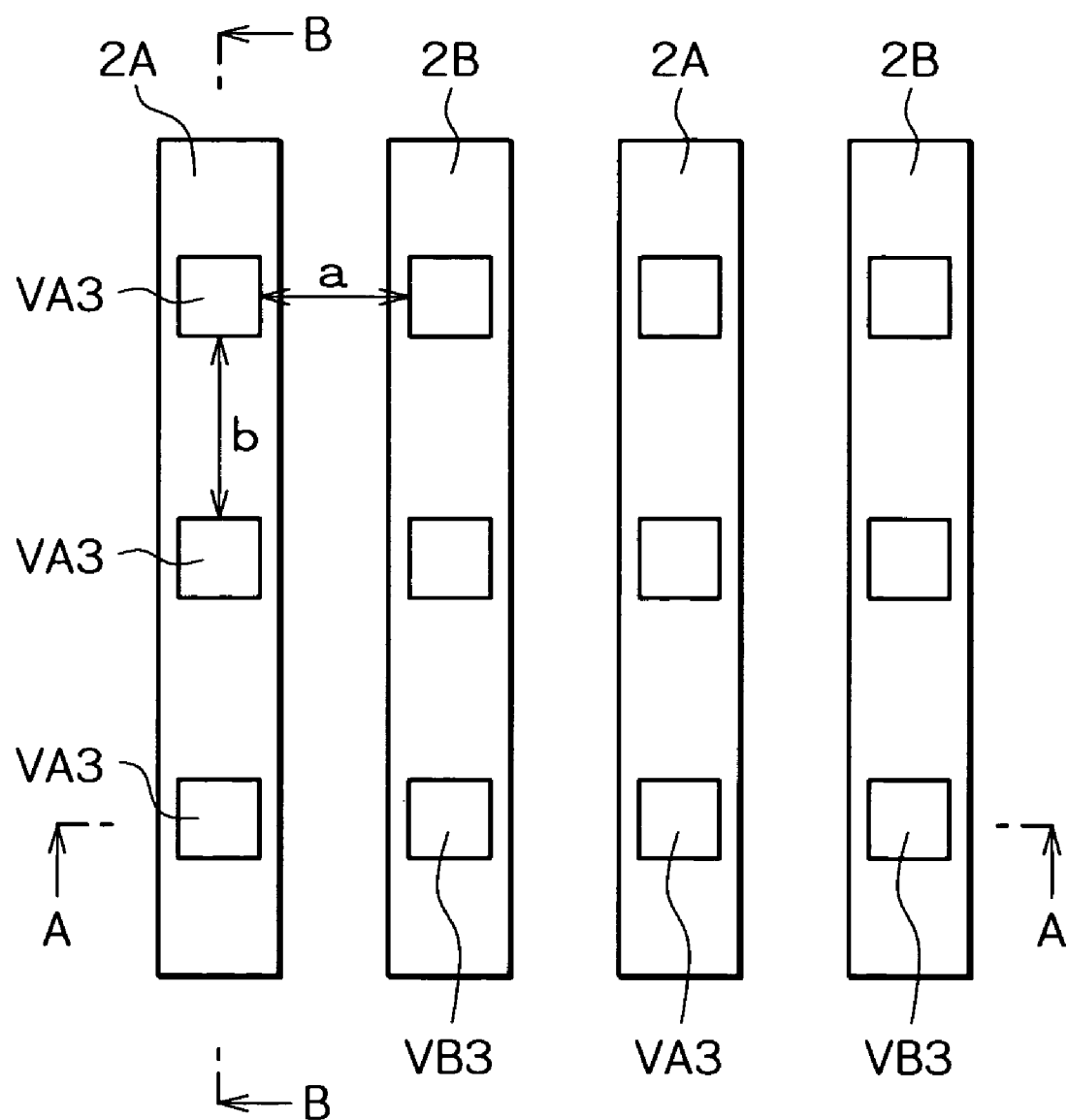
FIG. 4 is a plan view showing the MIM capacitor.

A preferred embodiment of the present invention will be specifically described as follows referring to the attached drawings. FIG. 3 is the perspective view showing the MIM capacitor provided in the semiconductor device according to this embodiment, FIG. 4 is the plan view showing the MIM capacitor, FIG. 5A is the sectional view by A—A line shown in FIG. 4, and FIG. 5B is the sectional view by B—B line.

As shown in FIG. 3, the semiconductor device according to this embodiment is provided with a semiconductor substrate (not shown), and a plurality of wiring layers, nine layers for example, are laminated on the semiconductor substrate. Out of the nine wiring layers, the second to fifth wiring layers (hereinafter, referred to as wiring layers M2 to M5) from the bottom, that is, from the semiconductor substrate are middle wiring layers, which are provided using the same design rule with each other. The sixth to ninth wiring layers (hereinafter, referred to as wiring layers M6 to M9) from the bottom are global wiring layers, which has a different design rule from that of the wiring layers M2 to M5 and the minimum dimension is larger than that of the wiring layers M2 to M5. Further, the bottom wiring layer (wiring layer M1) has a different design rule from that of the wiring layers M2 to M5 and the minimum dimension is smaller than that of the wiring layers M2 to M5.

Figure 5A:
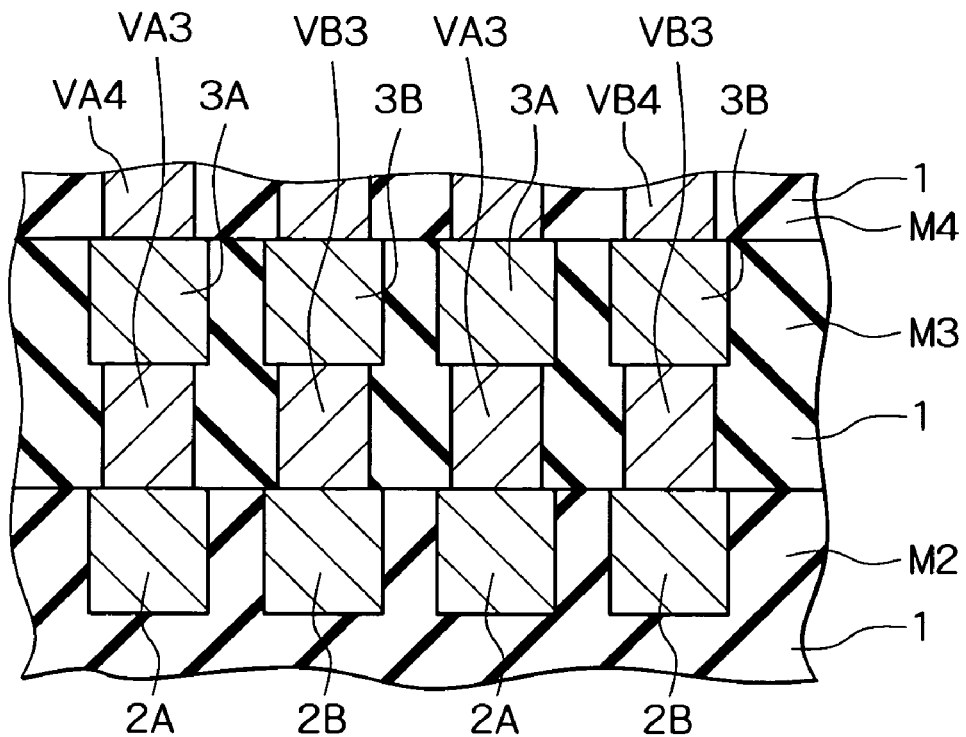
FIG. 5A is a sectional view by A—A line shown in FIG. 4.
Figure 5B:
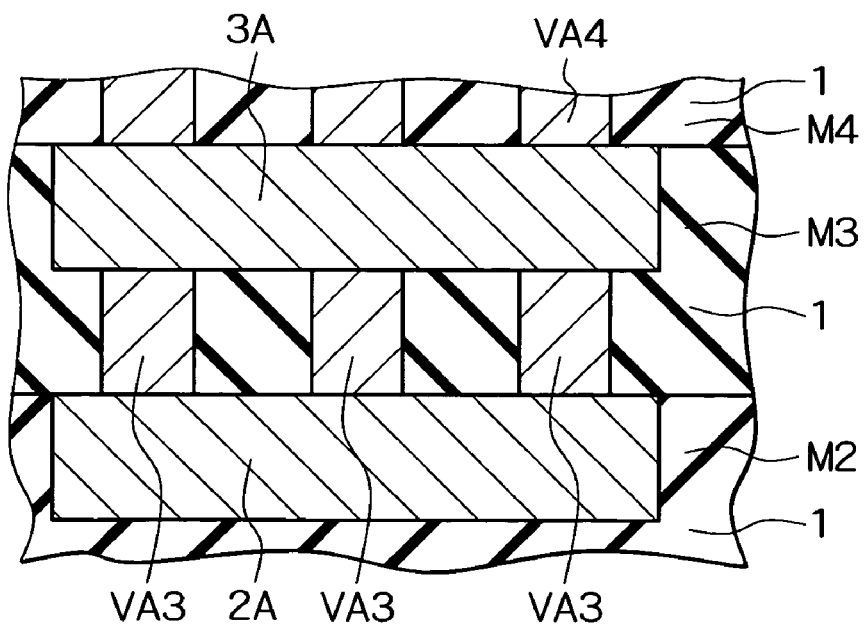
FIG. 5B is a sectional view by B—B line.

Furthermore, as shown in FIGS. 5A and 5B, an interlayer insulating film 1 is provided in each wiring layer, the wiring is provided on the surface of the interlayer insulating film 1, and the via, which connect the wiring and another wiring provided in the wiring layer under the wiring to each other, are provided under the wiring in the interlayer insulating film 1.

Particularly, in the capacitor-forming region of the semiconductor device, four pieces of strip-shaped electrodes, whose longitudinal directions are the same, are buried in the surface of the interlayer insulating film 1 at the same layer as the wiring. Specifically, in the wiring layer M2, two pieces each of electrode 2A and electrode 2B are provided on the surface of the wiring layer M2, which are arranged parallelly with each other, alternately, and remote from each other in a direction orthogonal to the lamination direction of the wiring layers M2 to M5. Similarly, in the wiring layer M3, the wiring layer M4 and the wiring layer M5, two pieces each of electrode 3A and electrode 3B, electrode 4A and electrode 4B, and electrode 5A and electrode 5B are respectively arranged parallelly with each other, alternately, and remote from each other. The electrodes 2A to 5B have been formed simultaneously with wirings in a region other than the capacitor-forming region in a regular wiring-forming process of the semiconductor device.

On the other hand, a global wiring layer, that is, any wiring layer out of the wiring layers M6 to M9, is provided with ground wiring GND and power source wiring VDD. Then, the electrode 5A provided in the wiring layer M5 is connected to the ground wiring GND through a via for example (not shown), and the electrode 5B is connected to the power source wiring VDD through a via for example (not shown). The length of the electrodes 2A to 5B in a longitudinal direction is 10 to 100 μm for example, the width may be a dimension allowed by the design rule, which is 0.3 μm or less for example, and is 0.14 μm that is the minimum dimension allowed by the design rule for example. Further, the distance between the electrode 2A and the electrode 2B is the minimum dimension allowed by the design rule, which is 0.3 μm or less that is 0.14 μm, for example. The same applies to the distance between the electrode 3A and the electrode 3B, the distance between the electrode 4A and the electrode 4B, and the distance between the electrode 5A and the electrode 5B, which is 0.3 μm or less that is 0.14 μm, for example. In the case where the gap between the wirings is wider than 0.14 μm, which is 0.28 μm for example, the capacitance value that is ⅔ times to substantially equivalent to a value when the wiring gap is set to 0.14 μm can be obtained if the thickness of the wiring layer is formed thicker than 0.3 μm, which is 0.45 to 0.6 μm for example.

Further, as shown in FIGS. 4, 5A and 5B, a plurality of via VA3, which connect the electrode 2A to the electrode 3A, are provided in the wiring layer M3. The via VA3 are arrayed in a line along the longitudinal direction of the electrodes 2A and 3A. The shape of the via VA3 is designed in a square shape, for example, viewing from the lamination direction of the wiring layers, and the length of one side of the square is 0.13 μm for example.

Furthermore, a plurality of via VB3, which connect the electrode 2B to the electrode 3B, are provided in the wiring layer M3. The array, shape and dimension of the via VB3 are the same as those of via VA3. Similarly, a plurality of via VA4, which connect the electrode 3A to the electrode 4A, and a plurality of via VB4, which connect the electrode 3B to the electrode 4B, are provided in the wiring layer M4, and a plurality of via VA5, which connect the electrode 4A to the electrode 5A, and a plurality of via VB5, which connect the electrode 4B to the electrode 5B, are provided in the wiring layer M5. The via VA3 to VB5 have been formed simultaneously with the via in a region other than the capacitor-forming region in the regular via-forming process of the semiconductor device.

With the above-described configuration, as shown in FIG. 3, the electrodes 2A to 5A and the via VA3 to VA5 are connected to each other to form a structure body 10A, and the structure body 10A is connected to the ground wiring GND via a terminal (not shown). Additionally, the electrodes 2B to 5B and the via VB3 to VB5 are connected to each other to form a structure body 10B, and the structure body 10B is connected to the power source wiring VDD via another terminal (not shown). The structure body 10A and the structure body 10B are insulated from each other.

The distance a (refer to FIG. 4) between the via VA3 and its adjacent via VB3 is 0.15 μm for example. The distance between the via VA4 and via VB4, and the distance between the via VA5 and via VB5 are also the same. Further, the distance b (refer to FIG. 4) between the via VA3 in the longitudinal direction of the electrode is larger than the above-described distance a, which is 0.17 to 0.19 μm for example. The same applies to the via VA4 to VB5. When the gap between the wirings is wide that is 0.28 μm for example, the size of the via is increased to approximately 0.28 μm, for example, or the height of the via is increased, so that a capacitance reduction caused by the wider gap between the wirings can be compensated by the volume of the side area of via.

Note that FIGS. 4, 5A and 5B show an example where three via are connected to one electrode for simplifying the drawings, but this embodiment is not limited to this, and four or more via may be connected to one electrode, for example.

Next, the operation of the semiconductor device according to this embodiment will be described. When a ground potential is applied to the ground wiring GND, the ground potential is applied to the structure body 10A that consists of the electrode 5A, via VA5, electrode 4A, via VA4, electrode 3A, via VA3 and electrode 2A. Further, when a power source potential is applied to the power source wiring VDD, the power source potential is applied to the structure body 10B that consists of the electrode 5B, via VB5, electrode 4B, via VB4, electrode 3B, via VB3 and electrode 2B. Since the structure body 10A and the structure body 10B are insulated from each other, a capacitor C is formed between the structure body 10A and the structure body 10B. Specifically, the gap between the electrodes 2A and 2B, the electrodes 3A and 3B, the electrodes 4A and 4B, and the electrodes 5A and 5B, which are adjacent to each other, and the gap between the via VA3 and VB3, the via VA4 and VB4, and the via VA5 and VB5, which are adjacent to each other mainly become the capacitor. The capacitor C is the decoupling capacitor connected to the power source in parallel, which can absorb the power source noise.

In this embodiment, the electrodes 2A and 2B can be simultaneously formed in the wiring layer M2 with the regular wirings. In the similar manner, the electrodes 3A to 5B can be simultaneously formed with the regular wirings in each wiring layer. In addition, the via VA3 and VB3 can be simultaneously formed in the wiring layer M3 with the regular via. Similarly, the via VA4 to VB5 can be simultaneously formed with the regular via in each wiring layer. Therefore, there is no need to provide a special process for forming the capacitor C.

Furthermore, the capacitor C having a four layer vertical stack structure is formed in the wiring layers M2 to M5 in this embodiment. Accordingly, the capacitance value of the capacitor C per unit area is large.

Moreover, since the electrodes 2A to 5B are formed in the wiring layers M2 to M5 whose design rules are the same with each other, the shape of the electrodes 2A to 5B is formed in the same strip shape and the electrodes 2A to 5A and the electrodes 2B to 5B can be formed so as to overlap with each other viewing from the lamination direction of the wiring layers. Further, the shape of the via VA3 to VB5 is formed in a same shape, and the via VA3 to VA5 and the via VB3 to VB5 can be formed so as to overlap with each other viewing from the lamination direction of the wiring layers. Consequently, the internal resistance in the structure body 10A and 10B is reduced, and the distance between the via in the structure body 10A and the via in the structure body 10B can be small. As a result, the capacitance value of the capacitor C per unit area can be further increased.

Furthermore, the shape of each electrode is formed in the strip shape viewing from the lamination direction of the wiring layers and the electrodes are arranged parallelly with each other. Therefore, the area of sides that contributes to the capacitance value of the capacitor C in each electrode can be increased, and the capacitance value of the capacitor C per unit area can be increased. Further, since the via between the electrodes are arranged in one line along the longitudinal direction of the electrode and all via to which the ground potential is applied are arranged so as to face the via to which the power source potential is applied, the capacitance value of the entire capacitor C increases.

In addition, the distance b between the via in the longitudinal direction of the electrode is set larger than the distance a in the width direction of the electrode, the lithography accuracy in forming via can be secured without increasing the distance between the structure body 10A and the structure body 10B. Thus, the via to which the ground potential is applied are prevented from contacting the via to which the power source potential is applied. Note that when the distance b is set to the minimum dimension on the design rule, which is 0.14 μm for example, the lithography accuracy in forming via is reduced, which may cause size increase of via and short circuit among via.

Although this embodiment has shown an example where the capacitor C was formed in the four wiring layers M2 to M5, the present invention is not limited to this, and the capacitor may be formed in three or less, or five or more wiring layers. However, it is preferable that the wiring layers where the capacitor is formed are provided by the same design rule with each other. Further, it is preferable that the capacitor is formed in the wiring layers of three layer or more in order to secure the capacitance volume per unit area.

Furthermore, the dimensions of the via VA3 to VB5 may be larger than the dimensions of the via in a region other than the capacitor-forming region of the semiconductor device. This increases the capacitance value generated among via in the capacitance C.

Moreover, the shape of the via is not limited to the square shape, but it may be a slit-shaped via extending in the longitudinal direction of the electrode, for example. This further increases the capacitance value generated among via.

Still further, this embodiment has shown an example where the structure body 10A was connected to the ground wiring GND and the structure body 10B was connected to the power source wiring VDD to form the capacitor C as the decoupling capacitor connected to the power source in parallel. However, the present invention is not limited to this, and the capacitor C may be used as a capacitor that constitutes a circuit.

Furthermore, the semiconductor device including the capacitor C may be formed on a semiconductor chip, and at this point, the ground wiring GND and the power source wiring VDD may be arranged at the periphery of the semiconductor chip.

The regular MIM capacitor may be formed in a layer under the capacitor C. Specifically, a plate-shaped upper electrode connected to the ground wiring GND is formed in a region of the wiring layer M1 immediately under the capacitor C, a capacitor insulating film having the thickness of 50 nm, for example, is formed in a region immediately under the upper electrode, a plate-shaped lower electrode connected to the power source wiring VDD is formed in a region immediately under the capacitor insulating film, and the capacitor may be formed by the upper electrode and the lower electrode. Thus, the plate-shaped capacitor formed in the wiring layer M1 and the capacitor C formed in the wiring layers M2 to M5 can be connected in parallel, which further increases the capacitance value per unit area.

Further, a capacitor by PN junction may be formed in a layer under the capacitor C. For example, an N-type semiconductor layer connected to the power source wiring VDD is formed on the surface of the semiconductor substrate or the wiring layer M1 in a region immediately under the capacitor C. Then, a P-type semiconductor layer connected to the ground wiring GND is formed on the surface of the semiconductor substrate or the wiring layer M1 in the region immediately under the capacitor C so as to connect to the N-type semiconductor layer. Consequently, PN junction of reverse bias is formed between the N-type semiconductor layer and the P-type semiconductor layer, and thus forming a capacitor. As a result, the capacitor by the PN junction and the capacitor C formed in the wiring layers M2 to M5 can be connected in parallel, which further increases the capacitance value per unit area.

Furthermore, an N-type semiconductor region connected to the power source wiring VDD is formed in a region immediately under the capacitor C in the semiconductor substrate, and a P-type semiconductor region connected to the ground wiring GND may be formed so as to connect to the N-type semiconductor region. Thus, the PN junction of reverse bias is formed between the N-type semiconductor region and the P-type semiconductor region, and thus forming a capacitor. As a result, the capacitor by the PN junction and the capacitor C formed in the wiring layers M2 to M5 can be connected in parallel, which further increases the capacitance value per unit area.

Still further, this embodiment has shown an example where the shape of electrodes was formed in the strip shape and the electrodes were arrayed parallelly with each other, but the present invention is not limited to this. For example, the shape of electrodes may be a curved wiring shape, or the electrodes connected to the ground wiring and the electrodes connected to the power source potential may be arrayed alternately in a matrix shape in a same wiring layer.

What is claimed is:

1. A semiconductor device, comprising: a plurality of wiring layers that are laminated with each other,
    each of said wiring layers comprising:
        an interlayer insulating film;
        first and second electrodes buried in the interlayer insulating film and remote from each other;
        a first via that connects the first electrode of one wiring layer to the first electrode of an adjacent wiring layer; and
        a second via that connects the second electrode of the one wiring layer to the second electrode of the adjacent wiring layer, and said connected first electrodes and said first via are connected to a first terminal, said connected second electrodes and said second via are connected to a second terminal, and a capacitor is formed between said first electrodes and said first via connected to said first terminal and said second electrodes and said second via connected to said second terminal; and
    wherein said semiconductor device further comprises an integrated circuit section, wherein a diameter of each of said first and second via is larger than a diameter of via provided in said integrated circuit section.

2. The semiconductor device according to claim 1, wherein a plurality of said wiring layers follow a same design rule; and
    said design rule comprises said first and second electrodes having widths in a first predetermined range, the distance between said first electrode and said second electrode in the same wiring layer being in a second predetermined range, and the distance between said first via and said second via that is formed in the closest position to the first via being in a third predetermined range.

3. The semiconductor device according to claim 2, wherein the distance between said first electrode and said second electrode in the same wiring layer is the minimum value of said second predetermined range.

4. The semiconductor device according to claim 2, wherein the distance between said first via and said second via that is formed in the closest position to the first via is the minimum value of said third predetermined range.

5. The semiconductor device according to claim 2, wherein said first and second electrodes are in strip shapes parallel to each other; and
    wherein the width of each of said first and second electrodes is the minimum value of said first predetermined range.

6. The semiconductor device according to claim 1, wherein said plurality of wiring layers comprises at least three layers.

7. The semiconductor device according to claim 6, wherein a plurality of said first via are arranged in a position where the first via overlap with each other and a plurality of said second via are arranged in a position where the second via overlap with each other, viewing from the lamination direction of said wiring layers.

8. The semiconductor device according to claim 1, wherein a plurality of said first electrodes are arranged in a position whereby the first electrodes overlap with each other and a plurality of said second electrodes are arranged in a position whereby the second electrodes overlap with each other, viewing from the lamination direction of said wiring layers.

9. The semiconductor device according to claim 1, wherein the distance between said first electrode and said second electrode is 0.3 µm or less in the same wiring layer.

10. The semiconductor device according to claim 1, wherein said first and second electrodes are in strip shapes that are parallel to each other.

11. The semiconductor device according to claim 10, wherein the width of each of said first and second electrodes is 0.3 µm or less.

12. The semiconductor device according to claim 10, wherein said first and second electrodes are provided in each of said wiring layers in plural numbers, and said first and second electrodes are arrayed alternately in each wiring layer.

13. The semiconductor device according to claim 10, wherein said first and second via are provided in plural numbers in the longitudinal direction of said first and second electrodes.

14. The semiconductor device according to claim 10, wherein at least one of said first and second via is a slit-shaped via extending in the longitudinal direction of said first and second electrodes.

15. The semiconductor device according to claim 1,
    wherein said first terminal is connected to ground wiring and said second terminal is connected to power source wiring.

16. The semiconductor device according to claim 15, wherein said wiring layers are formed in a semiconductor chip, and said ground wiring and said power source wiring are arranged in the periphery of said semiconductor chip.

17. A semiconductor device, comprising: a plurality of wiring layers that are laminated with each other,
    each of said wiring layers comprising:
    an interlayer insulating film;
    first and second electrodes buried in the interlayer insulating film and remote from each other;

a first via that connects the first electrode of one wiring layer to the first electrode of an adjacent wiring layer; and a second via that connects the second electrode of the one wiring layer to the second electrode of the adjacent wiring layer, and said connected first electrodes and said first via are connected to a first terminal, said connected second electrodes and said second via are connected to a second terminal, and a capacitor is formed between said first electrodes and said first via connected to said first terminal and said second electrodes and said second via connected to said second terminal;

wherein said first and second electrodes are in strip shapes that are parallel to each other;

wherein said first and second via are provided in plural numbers in the longitudinal direction of said first and second electrodes; and wherein the distance between said first via in the longitudinal direction of said first electrode is larger than the distance between the first and second via of said first and second electrodes that are adjacent in each of said wiring layers, and the distance between said second via in the longitudinal direction of said second electrode is larger than the distance between the first and second via of said first and second electrodes that are adjacent in each of said wiring layers.

18. A semiconductor device, comprising: a plurality of wiring layers that are laminated with each other, each of said wiring layers comprising:

an interlayer insulating film;

first and second electrodes buried in the interlayer insulating film and remote from each other;

a first via that connects the first electrode of one wiring layer to the first electrode of an adjacent wiring layer;

a second via that connects the second electrode of the one wiring layer to the second electrode of the adjacent wiring layer, and said connected first electrodes and said first via are connected to a first terminal, said connected second electrodes and said second via are connected to a second terminal, and a capacitor is formed between said first electrodes and said first via connected to said first terminal and said second electrodes and said second via connected to said second terminal;

wherein said semiconductor device further comprises: an upper electrode provided in a region including a region immediately under said first and second electrodes, and said upper electrode being connected to one of said first and second terminals;

an insulating film provided under the upper electrode; and a lower electrode provided under the insulating film and connected to the other one of said first and second terminals, wherein another capacitor is formed between said upper electrode and said lower electrode.

19. A semiconductor device, comprising: a plurality of wiring layers that are laminated with each other, each of said wiring layers comprising:

an interlayer insulating film;

first and second electrodes buried in the interlayer insulating film and remote from each other;

a first via that connects the first electrode of one wiring layer to the first electrode of an adjacent wiring layer;

a second via that connects the second electrode of the one wiring layer to the second electrode of the adjacent wiring layer, and said connected first electrodes and said first via are connected to a first terminal, said connected second electrodes and said second via are connected to a second terminal, and a capacitor is formed between said first electrodes and said first via connected to said first terminal and said second electrodes and said second via connected to said second terminal;

wherein said semiconductor device further comprises:

an N-type semiconductor layer, which is provided in a region including a region immediately under said first and second electrodes, said N-type semiconductor layer being connected to one terminal out of said first and second terminals, to which a higher potential is applied; and a P-type semiconductor layer, which is provided in the region including the region immediately under said first and second electrodes so as to contact said N-type semiconductor layer and connected to the other one terminal out of said first and second terminals, to which a lower potential is applied, wherein another capacitor is formed between said N-type semiconductor layer and said P-type semiconductor layer.

20. A semiconductor device, comprising: a plurality of wiring layers that are laminated with each other, each of said wiring layers comprising:

an interlayer insulating film;

first and second electrodes buried in the interlayer insulating film and remote from each other;

a first via that connects the first electrode of one wiring layer to the first electrode of an adjacent wiring layer;

a second via that connects the second electrode of the one wiring layer to the second electrode of the adjacent wiring layer, and said connected first electrodes and said first via are connected to a first terminal, said connected second electrodes and said second via are connected to a second terminal, and a capacitor is formed between said first electrodes and said first via connected to said first terminal and said second electrodes and said second via connected to said second terminal;

wherein said semiconductor device further comprises a semiconductor substrate provided under said wiring layers, and wherein the semiconductor substrate comprises:

an N-type semiconductor region, which is provided in a region including a region immediately under said first and second electrodes and connected to one terminal out of said first and second terminals, to which higher potential is applied; and a P-type semiconductor region, which is provided in the region including the region immediately under said first and second electrodes so as to contact said N-type semiconductor region and connected to the other one terminal out of said first and second terminals, to which lower potential is applied, and another capacitor is formed between said N-type semiconductor region and said P-type semiconductor region.

* * * * *